United States Patent
Park et al.

(10) Patent No.: US 11,619,545 B2
(45) Date of Patent: Apr. 4, 2023

(54) DETECTION OF PHOTON BY PAIRING AVALANCHE PHOTODIODES WITH DIFFERENT THRESHOLD VOLTAGES

(71) Applicants: ID QUANTIQUE S.A., Carouge (CH); WOORIRO CO., LTD., Gwangju (KR)

(72) Inventors: Chan Yong Park, Gwangju (KR); Soo Hyun Baek, Gwangju (KR); Chul Woo Park, Seoul (KR); Seok Beom Cho, Seoul (KR)

(73) Assignees: ID Quantique S.A., Carouge (CH); Wooriro Co., Ltd., Gwangju (KR)

( * ) Notice: Subject to any disclaimer, the term of this patent is extended or adjusted under 35 U.S.C. 154(b) by 394 days.

(21) Appl. No.: 16/645,346

(22) PCT Filed: Jul. 11, 2018

(86) PCT No.: PCT/KR2018/007849
§ 371 (c)(1),
(2) Date: Mar. 6, 2020

(87) PCT Pub. No.: WO2019/050146
PCT Pub. Date: Mar. 14, 2019

(65) Prior Publication Data
US 2021/0050461 A1 Feb. 18, 2021

(30) Foreign Application Priority Data

Sep. 7, 2017 (KR) .................. 10-2017-0114816

(51) Int. Cl.
*G01J 1/44* (2006.01)
*H01L 31/107* (2006.01)
(Continued)

(52) U.S. Cl.
CPC .............. *G01J 1/44* (2013.01); *G01J 1/4228* (2013.01); *H01L 31/02027* (2013.01);
(Continued)

(58) Field of Classification Search
CPC ............ H01L 31/107; H01L 31/02027; H01L 31/0232; H01L 31/02164; H01L 31/1075;
(Continued)

(56) References Cited

U.S. PATENT DOCUMENTS

| 8,338,858 B1 | 12/2012 | Bastiaans et al. |
| 2006/0273421 A1 | 12/2006 | Yasuoka et al. |

(Continued)

FOREIGN PATENT DOCUMENTS

| JP | H07-322431 A | 8/1994 |
| JP | 2003-243691 A | 8/2003 |

(Continued)

OTHER PUBLICATIONS

Akihisa Tomita and Kazuo Nakamura, "Balanced, gated-mode photon detector for quantum-bit discrimination at 1550 nm," 2002, Optica Publishing Group, Opt. Lett. 27, 1827-1829 (Year: 2002).*

(Continued)

*Primary Examiner* — Jennifer D Bennett
*Assistant Examiner* — Erin R Garber
(74) *Attorney, Agent, or Firm* — Fenwick & West LLP

(57) ABSTRACT

A photon detection device having a high light detection efficiency. The photon detection device includes a first light reception part which receives a gate signal and outputs a first signal; a second light reception part which receives a gate signal and outputs a second signal; and a determination part which determines whether or not a photon is received, on the basis of the first signal from the first light reception part and the second signal from the second light reception part. The photon is incident on the first light reception part among the (Continued)

first light reception part and the second light reception part, and the breakdown voltage of the second light reception part is higher than the breakdown voltage of the first light reception part.

16 Claims, 10 Drawing Sheets

(51) Int. Cl.
    *H01L 31/02*         (2006.01)
    *G01J 1/42*          (2006.01)
    *H01L 31/0232*     (2014.01)

(52) U.S. Cl.
    CPC ........ *H01L 31/0232* (2013.01); *H01L 31/107* (2013.01); *G01J 2001/442* (2013.01); *G01J 2001/444* (2013.01); *G01J 2001/4466* (2013.01); *H01L 31/02016* (2013.01)

(58) Field of Classification Search
    CPC ......... H01L 31/02016; H01L 31/02327; H01L 27/1463; H01L 27/14607; H01L 31/173; G01J 1/44; G01J 1/4228; G01J 2001/442; G01J 2001/4466; G01J 2001/444; G01J 1/46
    See application file for complete search history.

(56) References Cited

U.S. PATENT DOCUMENTS

| | | | |
|---|---|---|---|
| 2008/0220598 A1* | 9/2008 | Ben-Michael | H01L 21/223 |
| | | | 438/542 |
| 2011/0133058 A1 | 6/2011 | Kang | |
| 2011/0169117 A1* | 7/2011 | McIntosh | H01L 31/02162 |
| | | | 257/E31.128 |
| 2012/0085891 A1* | 4/2012 | Cho | G01J 1/44 |
| | | | 250/214.1 |
| 2013/0334434 A1 | 12/2013 | Nyman et al. | |
| 2014/0321862 A1* | 10/2014 | Frohlich | H04B 10/70 |
| | | | 250/214 R |
| 2016/0079464 A1* | 3/2016 | Sasaki | H01L 31/02005 |
| | | | 257/432 |
| 2019/0067495 A1* | 2/2019 | Daly | H01L 31/03529 |
| 2020/0386901 A1* | 12/2020 | Furumiya | A61B 6/037 |

FOREIGN PATENT DOCUMENTS

| | | |
|---|---|---|
| JP | 2004-264097 A | 9/2004 |
| KR | 10-2003-0082013 A | 10/2003 |
| KR | 10-1333806 B1 | 11/2013 |
| KR | 10-2016-0048436 A | 5/2016 |
| KR | 10-1672509 B1 | 11/2016 |

OTHER PUBLICATIONS

Tomita, A. et al., "Balanced, gated-mode photon detector for quantum-bit discrimination at 1550 nm," Optics Letters, vol. 27, No. 20, Oct. 15, 2002, pp. 1827-1829.
Zhang, J. et al., "Advances in InGaAs/InP single-photon detector systems for quantum communication," Light: Science & Applications, vol. 4, May 8, 2015, pp. 1-13.
PCT International Search Report (with English translation) & Written Opinion, International Application No. PCT/KR2018/007849, dated Oct. 10, 2018, 9 Pages.

* cited by examiner

DETECTION OF PHOTON BY PAIRING AVALANCHE PHOTODIODES WITH DIFFERENT THRESHOLD VOLTAGES

TECHNICAL FIELD

The present disclosure relates to a photon detection device and a photon detection method, and, particularly, to a photon detection device having high light-detection efficiency and a photon detection method.

BACKGROUND ART

With advanced information communication technology, a quantum cryptography communication technology is being developed. In the quantum cryptography communication technology, a technology for detecting an optical signal as weak as a single-photon is becoming important.

A single-photon detection device is used to detect a weak optical signal such as a signal photon. An avalanche photodiode is normally used as a light-reception element of the single-photon detection device.

When the avalanche photodiode of the single-photon detection device operates in a Geiger mode, an avalanche signal may be generated by the avalanche photodiode.

When the avalanche signal generated by the avalanche photodiode is not larger than a capacitive response signal of the avalanche photodiode, it is difficult to obtain (or detect) only the avalanche signal.

When the single-photon detection device does not detect the avalanche signal, the single-photon detection device may not detect a weak optical signal, such as a single photon.

DETAILED DESCRIPTION OF THE INVENTION

Technical Problem

An aspect of the present disclosure is to provide a photon detection device having high light-detection efficiency and a photon detection method.

Technical Solution

In order to achieve the aspect described above, a photon detection device according to one embodiment of the present disclosure includes: a first light-reception part configured to receive a gate signal and output a first signal; a second light-reception part configured to receive the gate signal and output a second signal; and a determination part configured to determine whether a photon is received, based on the first signal received from the first light-reception part and the second signal received from the second light-reception part.

Specifically, a breakdown voltage of the first light-reception part configured to receive the photon may be lower than a breakdown voltage of the second light-reception part.

Specifically, the gate signal may be maintained at a first voltage for an active time period and may be maintained at a second voltage lower than the first voltage for a non-active time period other than the active time period.

Specifically, the first voltage may be higher than the breakdown voltage of the first light-reception part and lower than the breakdown voltage of the second light-reception part, or may be higher than the breakdown voltage of the first light-reception part and the breakdown voltage of the second light-reception part.

Specifically, the determination part may determine whether the photon is received, based on a signal generated by combining the second signal, the phase of which has been inverted, with the first signal.

Specifically, the first signal may include a signal originating from a photon reception and a signal originating from the first light-reception part, and the second signal may include a signal originating from the second light-reception part.

Specifically, the signal originating from the first light-reception part may be a first capacitive response signal originating from capacitance of the first light-reception part, and the signal originating from the second light-reception part may be a second capacitive response signal originating from capacitance of the second light-reception part, and the first capacitive response signal may be substantially identical to the second capacitive response signal.

Specifically, a multiplication layer included in the first light-reception part and a multiplication layer included in the second light-reception part have different thicknesses.

Specifically, when the thickness of the multiplication layers is in proportion to a magnitude of the breakdown voltage, the multiplication layer included in the second light-reception part is thicker than the multiplication layer included in the first light-reception part.

Specifically, the multiplication layer included in the first light-reception part and the multiplication layer included in the second light-reception part have different diameters.

Specifically, the multiplication layer included in the second light-reception part has a larger diameter than the multiplication layer included in the first light-reception part.

Specifically, the photon detection device may include a substrate on which the first light-reception part and the second light-reception part are formed.

Specifically, the first light-reception part and the second light-reception part may be positioned on a first surface of the substrate.

Specifically, the photon detection device may further include a blocking film positioned on a second surface of the substrate facing the first surface of the substrate.

Specifically, the blocking film may include a transmission hole positioned to correspond to the first light-reception part.

Specifically, the photon detection device may further include an anti-reflection film positioned in the transmission hole.

Specifically, the first surface of the substrate may include a first area and a second area separated by an element separation groove between the first light-reception part and the second light-reception part; the first light-reception part may be positioned in the first area; and the second light-reception part may be positioned in the second area.

A photon detection method according to one embodiment of the present disclosure includes: receiving a first signal according to supply of a gate signal from a first light-reception part which receives a photon and has a first breakdown voltage; receiving a second signal according to supply of the gate signal from a second light-reception part which has a second breakdown voltage higher than the first breakdown voltage; and determining whether a photon is received, based on the first signal and the second signal.

Specifically, the gate signal may be maintained at a first voltage for an active time period and may be maintained at a second voltage higher than the first voltage for a non-active time period other than the active time period.

Specifically, the first voltage may be higher than a breakdown voltage of the first light-reception part and lower than a breakdown voltage of the second light-reception part, or may be higher than the breakdown voltage of the first light-reception part and the breakdown voltage of the second light-reception part.

Specifically, in the determining of whether the photon is received, based on the first signal and the second signal, whether the photon is received may be determined based on a signal generated by combining the second signal, the phase of which has been inverted, with the first signal.

Advantageous Effects

The photon detection device and the photon detection method according to the present disclosure can have an effect of detecting a photon with high photon-detection efficiency.

MODE FOR CARRYING OUT THE INVENTION

Figure 1:
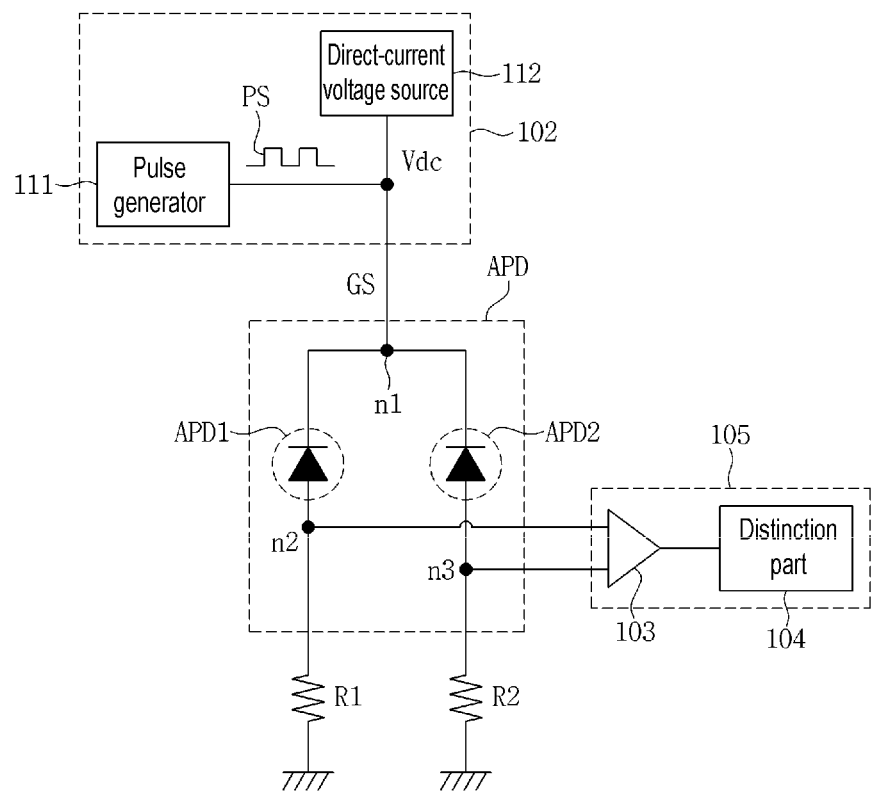
FIG. 1 illustrates a photon detection device according to one embodiment of the present disclosure.

Advantages and features of the present disclosure and a method for realizing them will be apparent when reference is made to the embodiments described in detail below together with the accompanying drawings. However, the present disclosure is not limited to the embodiments described below but may be implemented in various different ways. The present embodiments are provided in order to make the present disclosure complete and to fully inform a person skilled in the art, to which the present disclosure belongs, of the scope of the disclosure. The present disclosure is merely defined by the claims. Therefore, in several embodiments, well-known processes, a well-known element structure, and well-known technologies will not be described in detail in order to prevent the present disclosure from being ambiguously interpreted. The same reference signs indicate the same elements throughout the specification.

In the drawings, the thickness of layers and areas may be exaggerated for clarity. The same drawing signs are assigned to similar parts throughout the specification. It will be understood that when an element such as a layer, a film, an area, or a substrate is referred to as being "on" another element, it can be "directly on" said another element or intervening elements may also be present. In contrast, it will be understood that when an element is referred to as being "directly on" another element, there are no intervening elements present. Further, it will be understood that when an element such as a layer, a film, an area, or a substrate is referred to as being "beneath" another element, it can be "directly beneath" said another element or intervening elements may also be present. In contrast, it will be understood that when an element is referred to as being "directly beneath" another element, there are no intervening elements present.

The spatially relative terms "below", "beneath", "lower", "above", "upper", etc. may be used to easily describe the correlation between a device or elements and other devices or elements, as illustrated in the drawings. The spatially relative terms are to be understood as terms including different directions of the device in use or operation in addition to the directions illustrated in the drawings. For example, when a device illustrated in the drawings is flipped, the device described as being positioned "below" or "beneath" another device may be placed "above" said another device. Thus, the exemplary term "below" may include both downward and upward directions. The device may also be oriented in other directions. Therefore, the spatially relative terms may be interpreted according to orientation.

In present specification, when a part is described as being connected to another part, it includes not only a direct connection therebetween but also the case where the part is electrically connected with said another part with another element therebetween. Further, when a part is described as including an element, it is understood that the part does not exclude another element unless specifically stated to the contrary, and thus may include said another element.

The terms "first", "second", "third", etc. in the present specification may be used to describe various elements, but such elements are not limited by these terms. The terms described above may be used for the purpose of distinguishing one element from another element. For example, without departing from the scope of the present disclosure, a first element may be referred to as a second or third element, and similarly, the second or third element may be alternately named.

Unless otherwise defined, all terms (including technical and scientific terms) used in the present specification may be used in a sense that can be commonly understood by a person skilled in the art to which the present disclosure belongs. In addition, terms that are defined in a normally used dictionary are not ideally or excessively interpreted unless they are specifically defined clearly.

Hereinafter, a photon detection device according to the present disclosure will be described in detail with reference to FIGS. 1 to 7B.

FIG. 1 illustrates a photon detection device according to one embodiment of the present disclosure.

As illustrated in FIG. 1, a photon detection device according to one embodiment of the present disclosure includes a light-reception part (APD), a gate signal generator 102, and a determination part 105.

The light-reception part (APD) includes a first light-reception part (APD1) and a second light-reception part (APD2).

The first light-reception part (APD1) may include an avalanche photodiode but is not limited thereto, and thus may include an element configured to detect a photon. For example, the first light-reception part (APD1) may be an avalanche photodiode.

The second light-reception part (APD2) may include an avalanche photodiode but is not limited thereto, and thus may include an element configured to detect a photon. For example, the second light-reception part (APD2) may be an avalanche photodiode.

The first light-reception part (APD1) is connected to the second light-reception part (APD2) in parallel.

For example, each of the first light-reception part (APD1) and the second light-reception part (APD2) may include a cathode electrode and an anode electrode. The cathode electrode of the first light-reception part (APD1) and the cathode electrode of the second light-reception part (APD2) are connected to a first node (n1), the anode electrode of the first light-reception part (APD1) is connected to a second node (n2), and the anode electrode of the second light-reception part (APD2) is connected to a third node (n3).

The first node (n1) is connected to the gate signal generator 102.

The second node (n2) is connected to a resistor (R1). For example, the second node (n2) may be connected to one terminal of the resistor (R1). At this time, the other terminal of the resistor (R1) is connected to the ground.

The third node (n3) is connected to a resistor (R2). For example, the third node (n3) may be connected to one terminal of the resistor (R3). At this time, the other terminal of the resistor (R2) is connected to the ground.

The gate signal generator 102 outputs a gate signal (GS) in a square-wave form. For example, the gate signal generator 102 may output the gate signal (GS) in a pulse form or in a sign-wave form.

The gate signal (GS) output from the gate signal generator 102 is supplied to the first light-reception part (APD1) and the second light-reception part (APD2).

Specifically, the gate signal (GS) output from the gate signal generator 102 may be applied to each of the first light-reception part (APD1) and the second light-reception part (APD2) through the first node (n1). For example, the gate signal (GS) output from the gate signal generator 102 may be applied to each of the cathode electrode of the first light-reception part (APD1) and the cathode electrode of the second light-reception part (APD2) through the first node (n1).

At least one of the first light-reception part (APD1) and the second light-reception part (APD2) operates in a gated Geiger mode (hereinafter, referred to as "Geiger mode") by the gate signal (GS) output from the gate signal generator 102.

The gate signal generator 102 includes a direct-current voltage source 112 and a pulse generator 111. The direct-current voltage source 112 provides a direct-current voltage (Vdc), and the pulse generator 111 generates a pulse (PS). For example, the direct-current voltage source 112 may provide a bias voltage at the direct-current voltage (Vdc).

The gate signal (GS) generated by the gate signal generator 102 may be a pulse (PS) swinging with reference to the direct-current voltage (Vdc).

Figure 2:
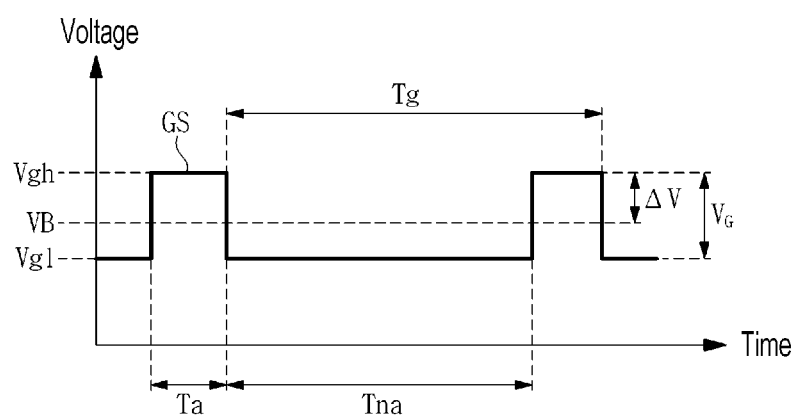
FIG. 2 illustrates a waveform of a gate signal output from a gate signal generator in FIG. 1.

FIG. 2 illustrates a waveform of the gate signal (GS) output from the gate signal generator 102 in FIG. 1.

As illustrated in FIG. 2, the gate signal (GS) is maintained at a first voltage (Vgh) for an active time period (Ta), and is maintained at a second voltage (Vgl) for a non-active time period (Tna) other than the active time period (Ta).

Specifically, the gate signal (GS) is maintained at the first voltage (Vgh) higher than a direct-current voltage for the active time period (Ta), and is maintained at the second voltage (Vgl) lower than the first voltage (Vgh) for the non-active time period (Tna).

Here, the second voltage (Vgl) of the gate signal (GS) may correspond to the above-described direct-current voltage (Vdc), i.e., a bias voltage.

Reference sign Vg in FIG. 2 is an amplitude of the gate signal (GS). Reference sign AV is an absolute value of the difference voltage between a breakdown voltage (VB) and the first voltage (Vgh) of the gate signal (GS). The difference voltage (AV) is an over-bias voltage.

Reference sign Tg in FIG. 2 is one cycle of the gate signal (GS).

Light from the outside is incident on the light-reception part (APD) for the active time period (Ta) described above. For example, a photon may be incident on the light-reception part (APD) from a light source for the active time period (Ta).

In this case, the photon is incident only on one of the first light-reception part (APD1) and the second light-reception part (APD2).

For example, the photon may be incident on the first light-reception part (APD1) and may not be incident on the second light-reception part (APD2). In this case, the first light-reception part (APD1), which receives the photon, may be defined as a main light-reception part (APD), and the second light-reception part (APD2), which does not receive the photon, may be defined as an auxiliary light-reception part (APD).

The photon from the outside may be controlled to be incident on the first light-reception part (APD1) for the active time period (Ta) during which the gate signal (GS) is maintained at the first voltage (Vgh).

The first voltage (Vgh) is higher than the breakdown voltage (VB) of the first light-reception part (APD1). When the first voltage (Vgh) is applied to the first light-reception part (APD1), the first light-reception part (APD1) operates in a Geiger mode. In other words, the first light-reception part (APD1) operates in the Geiger mode for the active time period (Ta).

The gate signal (GS) may have a frequency of tens of megahertz (MHz) to several gigahertz (GHz).

When light or a photon (e.g. a single photon) is incident on the first light-reception part (APD1) in the Geiger mode and a carrier (an electron-hole pair) is generated in the first light-reception part (APD1), an electron or a hole moves to a multiplication layer of the first light-reception part (APD1) and is multiplied by an avalanche mechanism.

For example, during forward bias, an avalanche photodiode (i.e. the first light-reception part (APD1)) is turned on at a threshold voltage (e.g. about 1.0 V) or higher.

On the other hand, during reverse bias, when a voltage applied from the outside is equal to or higher than the breakdown voltage (VB), a high electric field is formed on the PN junction surface of the avalanche photodiode. At this time, when an electron or a hole generated by absorption of a photon is injected into a multiplication layer to which a high electric field has been applied, electron avalanche breakdown occurs in which the electron or hole is multiplied by a current via continuous avalanche multiplication (avalanche impact ionization). Thus, a reverse current increases rapidly.

In the Geiger mode of the avalanche photodiode, a reverse bias is higher than a breakdown voltage and a photon may be detected.

The avalanche photodiode may detect a photon even when the reverse bias is equal to or lower than the breakdown voltage. When the reverse bias is equal to or lower than the breakdown voltage, the avalanche photodiode has low-gain and linear photon detection characteristics. That is, the avalanche photodiode generates a photoelectric current which is in proportion to the number of incident photons.

However, the avalanche photodiode loses a linear photon characteristic in the Geiger mode. In the Geiger mode, the avalanche photodiode provides high gain in exchange for losing the linear photon characteristic.

In the Geiger mode, the avalanche photodiode may theoretically detect a single photon and may generate the same into a photoelectric current. Here, the photoelectric current generated by the avalanche photodiode in the Geiger mode is referred to as a Geiger current.

Therefore, in the Geiger mode, a relatively large photoelectric current can be generated even when a small number of photons are detected, and thus photons can be detected without a separate complicated low-noise amplifier.

Meanwhile, even when there is no photon incident from the outside, the avalanche photodiode may output a signal in the same manner as when a photon is detected. Such a detection rate is referred to as a dark count probability per gate (DCP).

A dark current of the avalanche photodiode, represented by a dark count, is generated by: firstly, generation of an electron-hole pair by thermal excitation; secondly, current occurrence by a tunnel effect in a depletion region; and thirdly, a phenomenon in which a charge generated by light incident earlier is confined and then avalanched by subsequent reverse bias.

In this single-photon detection device, some of charge carriers generated while an avalanche phenomenon occurs do not immediately disappear. Specifically, in a single-photon detection device in which an avalanche photodiode operates in a Geiger mode, some of charge carriers generated through an avalanche phenomenon may remain inside the avalanche photodiode.

Thus, the charge carriers remaining inside the avalanche photodiode cause an avalanche when a subsequent gate signal (GS) is applied to the avalanche photodiode. This phenomenon is referred to as an after-pulse-noise effect.

In quantum information communication, after-pulse-noise is a factor which reduces a signal-to-noise ratio and is an obstacle to high-speed photon detection. Therefore, it is preferable to reduce the probability of occurrence of an after-pulse if possible.

When the first voltage (Vgh) of the gate signal (GS) is applied to the cathode electrode of the avalanche photodiode, the avalanche photodiode is turned on. A signal is output from the anode electrode of the avalanche photodiode which has been turned on. The signal includes a capacitive response signal caused by capacitance unique to the avalanche photodiode. The capacitive response signal acts as a background signal of an avalanche signal.

For example, a signal (hereinafter, referred to as "first signal") output from the first light-reception part (APD1) supplied with a photon and the first voltage (Vgh) includes an avalanche signal and a capacitive response signal (hereinafter, referred to as "first capacitive response signal") unique to the first light-reception part (APD1).

A signal (hereinafter, referred to as "second signal") output from the second light-reception part (APD2) supplied with the first voltage (Vgh) includes a capacitive response signal (hereinafter, referred to as "second capacitive response signal") unique to the second light-reception part (APD2). That is, unlike the first light-reception part (APD1), the second light-reception part (APD2) that is not provided with a photon does not output an avalanche signal and outputs only the second capacitive response signal.

Figure 3:
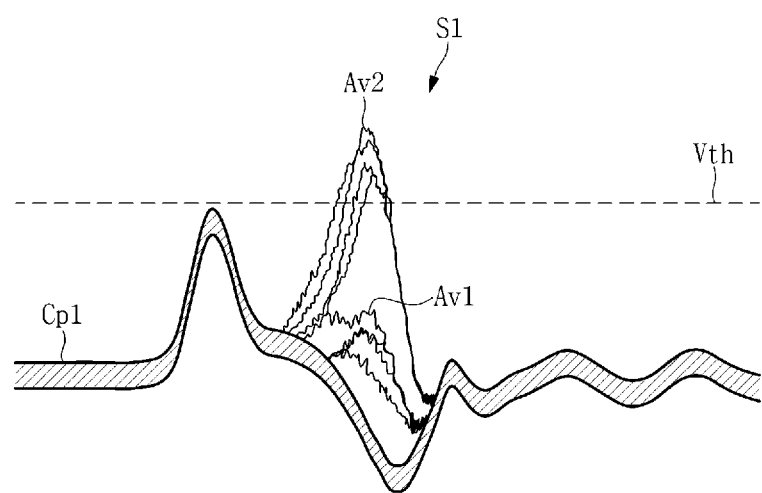
FIG. 3 illustrates a waveform of a first signal output from a first light-reception part.

FIG. 3 illustrates a waveform of a first signal (S1) output from the first light-reception part (APD1).

As illustrated in FIG. 3, the first signal (S1) includes an avalanche signal (Av) and a first capacitive response signal (Cp1). That is, since a photon and a gate signal (GS) are applied to the first light-reception part (APD1), the first signal (S1) output from the first light-reception part (APD1) includes the avalanche signal (Av) and the first capacitive response signal (Cp1).

Although not illustrated, a second signal from the second light-reception part (APD2) includes a second capacitive response signal. That is, as described above, since a photon is not input in the second light-reception part (APD2), when a first gate signal (GS) is applied to the second light-reception part (APD2), the second light-reception part (APD2) outputs a capacitive response signal caused by capacitance unique to the second light-reception part (APD2).

A digital value of an avalanche signal is determined based on a threshold value (Vth).

For example, as illustrated in FIG. 3, when an avalanche signal (Av1) is equal to or lower than the threshold value (Vth), a digital value of the avalanche signal (Av1) is determined to be zero (0). On the other hand, as illustrated in FIG. 3, when an avalanche signal (Av2) is higher than the threshold value (Vth), the digital value of the avalanche signal (Av2) is determined to be one (1). When the digital value of the avalanche signal (Av2) is determined to be one (1), it is determined that a photon has been incident on the first light-reception part (APD1).

As the threshold value (Vth) becomes smaller, an avalanche signal having a smaller magnitude may be detected. In this case, a smaller number of photons may also be detected.

However, when the threshold value (Vth) is lower than the first capacitive response signal (Cp1), a first digital value may be calculated by the first capacitive response signal (Cp1), regardless of an avalanche signal. In other words, although a photon has not been incident on the first light-reception part (APD1), a digital value of one (1) may be calculated.

In order to prevent such a malfunction, the threshold value (Vth) is required to be at least larger than the first capacitive response signal (Cp1). However, in order to increase the threshold value (Vth), it is also required to increase the degree of multiplication of the first light-reception part (APD1). When the degree of multiplication of the first light-reception part (APD1) increases, the after-pulse noise described above may increase.

The first light-reception part (APD1) and the second light-reception part (APD2) have substantially the same capacitive response characteristic. In other words, the first capacitive response signal (Cp1) is substantially identical to a second capacitive response signal. For example, a second capacitive response signal (Cp2) may be identical to the first capacitive response signal (Cp1) in FIG. 3.

The determination part 105 determines whether a photon is received, based on the first signal (i.e. the avalanche signal (Av) and the first capacitive response signal (Cp1)) from the first light-reception part (APD1) and on the second signal (i.e. the second capacitive response signal (Cp2)) from the second light-reception part (APD2).

The determination part 105 may include a differential part 103 and a distinction part 104.

The differential part 103 receives the first signal from the anode electrode of the first light-reception part (APD1), receives the second signal from the anode electrode of the second light-reception part (APD2), and outputs a difference value between the first signal and the second signal.

An operation of the differential part 103 will be described with reference to FIGS. 4A and 4B.

Figure 4A:
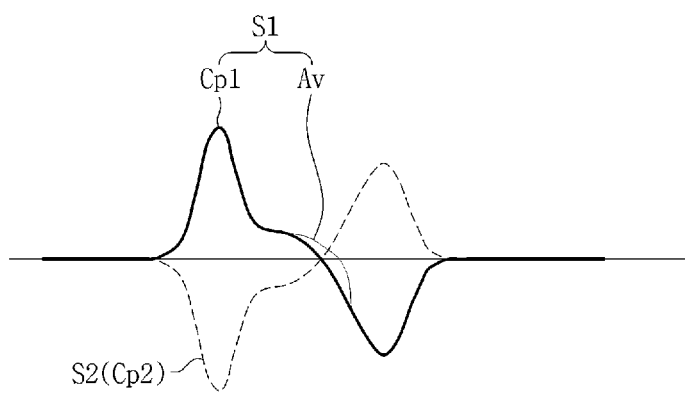
FIGS. 4A and 4B are views for describing an operation of a differential part in FIG. 1.
Figure 4B:
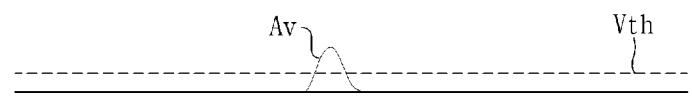

FIGS. 4A and 4B are views for describing an operation of the differential part 103 in FIG. 1.

As illustrated in FIG. 4A, the differential part 103 inverts the phase of a second signal (S2) by 180 degrees, and combines the first signal (S1) and the second signal (S2), the phase of which has been inverted.

As described above, the first capacitive response signal (Cp1) and the second capacitive response signal (Cp2) have substantially the same magnitude. Therefore, when the first signal (S1) and the second signal (S2), the phase of which has been inverted, are combined, only the avalanche signal (Av) of the first signal (S1) is detected.

That is, the second capacitive response signal (Cp2) of the second signal (S2), the phase of which has been inverted, is equal in magnitude to, but is different in polarity from the first capacitive response signal (Cp1). Thus, the sum of the first capacitive response signal (Cp1) and the second capacitive response signal (Cp2), which have the same magnitude (the same magnitude with reference to an absolute value), is substantially zero (0). Therefore, as illustrated in FIG. 4B, a signal (i.e. an output signal of the differential part 103) generated by a combination of the first signal (S1) and the second signal (S2), the phase of which has been inverted, is an avalanche signal (Av).

As described above, the photon detection device according to one embodiment of the present disclosure may remove a capacitive response signal which is a background signal, and thus exhibits relatively high light-detection efficiency even under a low bias condition. Further, as the magnitude of the gate signal (GS) is smaller, noise due to the after-pulse noise effect may also be reduced.

The first light-reception part (APD1) and the second light-reception part (APD2) described above may be positioned on different substrates. For example, the first light-reception part (APD1) may be positioned on a first substrate, and the second light-reception part (APD2) may be positioned on a second substrate different from the first substrate.

An element including the first light-reception part (APD1) and the first substrate may be defined as a first module, and an element including the second light-reception part (APD2) and the second substrate may be defined as a second module. When the first light-reception part (APD1) and the second light-reception part (APD2) are included in different modules as described above, an element characteristic of the first light-reception part (APD1) is different from an element characteristic of the second light-reception part (APD2). In this case, the element characteristic of the first light-reception part (APD1) and the element characteristic of the second light-reception part (APD2) may be adjusted to be identical to each other by tuning.

The first light-reception part (APD1) and the second light-reception part (APD2) may be positioned on the same substrate. For example, both the first light-reception part (APD1) and the second light-reception part (APD2) may be position on a substrate. The first light-reception part (APD1), the second light-reception part (APD2), and the substrate may be included in one module. When the first light-reception part (APD1) and the second light-reception part (APD2) are positioned in one module as described above, the element characteristic of the first light-reception part (APD1) is substantially identical to the element characteristic of the second light-reception part (APD2). Thus, the element characteristics may not be required to be tuned.

The first light-reception part (APD1) and the second light-reception part (APD2) may be integrated on a patterned sub-mount in a hybrid scheme. When the first light-reception part (APD1) and the second light-reception part (APD2) are manufactured in the hybrid scheme as described above, productivity may increase thanks to easy module assembling.

The first light-reception part (APD1) and the second light-reception part (APD2) may have different breakdown voltages. For example, the breakdown voltage of the second light-reception part (APD2) may be higher than the breakdown voltage of the first light-reception part (APD1).

Specifically, the second light-reception part (APD2), on which a photon is not incident, may have a higher breakdown voltage than the first light-reception part (APD1) on which a photon is incident. Alternatively, the second light-reception part (APD2), on which a photon is not incident, may have a lower breakdown voltage than the first light-reception part (APD1) on which a photon is incident. For example, the breakdown voltage of the second light-reception part (APD2) may be higher than the breakdown voltage of the first light-reception part (APD1) by 0.1 to 10 V.

If the breakdown voltage of the second light-reception part (APD2) is higher than the breakdown voltage of the first light-reception part (APD1), only the first light-reception part (APD1) may selectively operate in a Geiger mode when gate signals (GSs) having the same magnitude are applied to the first light-reception part (APD1) and the second light-reception part (APD2), respectively.

In other words, when the breakdown voltage of the second light-reception part (APD2) is higher than the breakdown voltage of the first light-reception part (APD1), in response to gate signals (GSs) having the same magnitude, the first light-reception part (APD1) operates in a Geiger mode but the second light-reception part (APD2) may not operate in the Geiger mode. For example, when the magnitude of the gate signals (GSs) is higher than the breakdown voltage of the first light-reception part (APD1) and is lower than the breakdown voltage of the second light-reception part (APD2), the first light-reception part (APD1) operates in the Geiger mode but the second light-reception part (APD2) may not operate in the Geiger mode.

The gate signals (GSs) applied to the first light-reception part (APD1) and the second light-reception part (APD2) may be higher than the breakdown voltage of the first light-reception part (APD1) and the breakdown voltage of the second light-reception part (APD2). Alternatively, the gate signals (GSs) applied to the first light-reception part (APD1) and the second light-reception part (APD2) may be higher than the breakdown voltage of the first light-reception part (APD1) and lower than the breakdown voltage of the second light-reception part (APD2).

This will be described in detail below with reference to FIG. 5.

Figure 5:
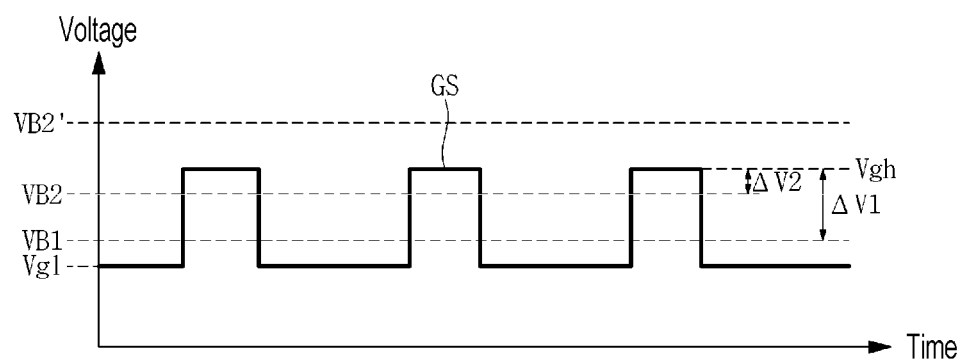
FIG. 5 is a view for describing the magnitude of avalanche multiplication according to a gate signal applied to each of a first light-reception part and a second light-reception part which have different breakdown voltages.

FIG. 5 is a view for describing the magnitude of avalanche multiplication according to a gate signal (GS) applied to each of the first light-reception part (APD1) and the second light-reception part (APD2) which have different breakdown voltages.

When the breakdown voltage of the first light-reception part (APD1) is VB1 and the breakdown voltage of the second light-reception part (APD2) is VB2, a first voltage (Vgh) of the gate signal (GS) is higher than VB1 and VB2. In this case, both the first light-reception part (APD1) and the second light-reception part (APD2) operate in a Geiger mode.

Since VB2 is higher than VB1, the difference voltage (AV1) (i.e., an absolute value of the difference voltage) between VB1 and the first voltage (Vgh) of the gate signal (GS) is sufficiently large but the difference voltage (AV2) (i.e., an absolute value of the difference voltage) between VB2 and the first voltage (Vgh) of the gate signal (GS) is considerably small. Therefore, avalanche multiplication of the first light-reception part (APD1) is considerably large but avalanche multiplication of the second light-reception part (APD2) is considerably small. In other words, the first light-reception part (APD1) operates in the Geiger mode, and thus the avalanche multiplication thereof is large. However, the second light-reception part (APD2) operates in a reverse-bias state lower than the reverse-bias state in the Geiger mode of the first light-reception part (APD1), and thus the avalanche multiplication of the second light-reception part (APD2) is small. That is, the avalanche multiplication of the second light-reception part (APD2) is much smaller than the avalanche multiplication of the first light-reception part (APD1) operating in the Geiger mode.

As described above, the avalanche multiplication of the second light-reception part (APD2) is small, and thus the dark count probability of the second light-reception part (APD2) is decreased. Further, as the dark count probability of the second light-reception part (APD2) is decreased, a noise pulse from the second light-reception part (APD2) is decreased. The noise pulse from the second light-reception part (APD2) may affect an output of the first light-reception part (APD1). Thus, when the noise pulse from the second light-reception part (APD2) is decreased, the reliability of the output of the first light-reception part (APD1) may be enhanced.

Further, when the noise pulse from the second light-reception part (APD2) is decreased, an output of the second light-reception part (APD2) by the gate signal (GS) may be closer to a capacitive response signal unique to the second light-reception part (APD2). In other words, as the noise pulse from the second light-reception part (APD2) is decreased, a capacitive response signal having a more accurate magnitude and shape may be detected from the output of the second light-reception part (APD2).

When the breakdown voltage of the first light-reception part (APD1) is VB1 and the breakdown voltage of the second light-reception part (APD2) is VB2', the first voltage (Vgh) of the gate signal (GS) is higher than VB1 and is lower than VB2'. In other words, VB2' is higher than the first voltage (Vgh) of the gate signal (GS). Therefore, the first light-reception part (APD1) operates in the Geiger mode but the second light-reception part (APD2) does not operate in the Geiger mode.

In this case, the capacitive response signal of the second light-reception part (APD2) may be identified from the second light-reception part (APD2) that does not operate in the Geiger mode. A signal output from the first light-reception part (APD1) includes an avalanche signal and the capacitive response signal of the second light-reception part (APD2). When the capacitive response signal of the first light-reception part (APD1) is substantially identical to the capacitive response signal of the second light-reception part (APD2), the avalanche signal output from the first light-reception part (APD1) may be detected using the signal output from the first light-reception part (APD1) and the signal output from the second light-reception part (APD2).

Figure 6:
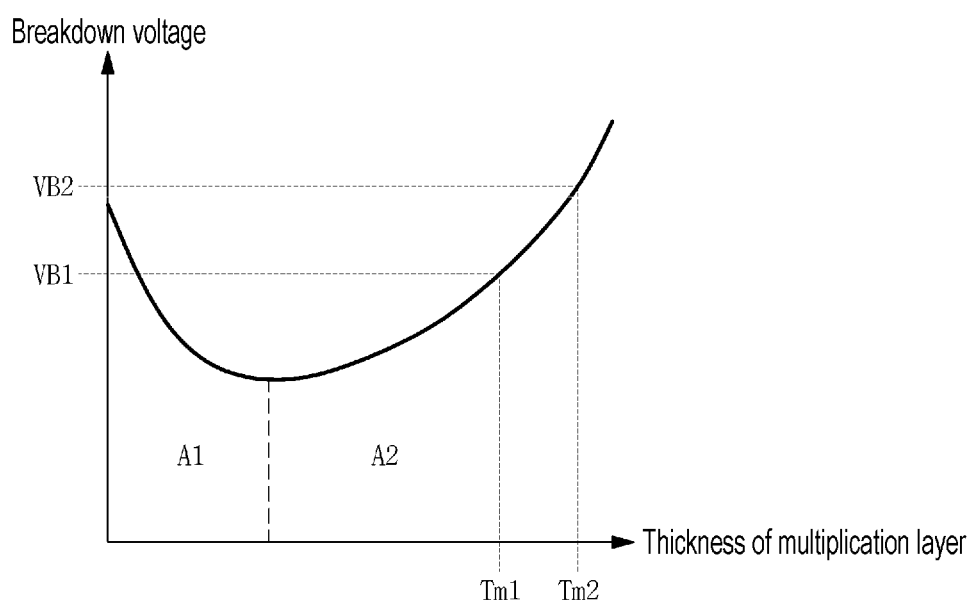
FIG. 6 is a characteristic curve representing a breakdown voltage change depending on the thickness of a multiplication layer of an avalanche photodiode.

FIG. 6 is a characteristic curve representing a breakdown voltage change depending on the thickness of a multiplication layer of an avalanche photodiode.

In the characteristic curve in FIG. 6, the X-axis indicates the thickness of a multiplication layer of an avalanche photodiode, and the Y-axis indicates the magnitude of a breakdown voltage of the avalanche photodiode.

As illustrated in FIG. 6, when the thickness of the multiplication layer of an avalanche photodiode is in a first area (A1), the breakdown voltage of the avalanche photodiode is inversely proportional to the thickness of the multiplication layer. In other words, the breakdown voltage of the avalanche photodiode is inversely proportional to the thickness of the multiplication layer in the first area (A1) of the characteristic curve. Therefore, in the first area (A1), as the thickness of the multiplication layer increases, the breakdown voltage decreases.

On the other hand, when the thickness of the multiplication layer of an avalanche photodiode is in a second area (A2), the breakdown voltage of the avalanche photodiode is in proportion to the thickness of the multiplication layer. In other words, the breakdown voltage of the avalanche photodiode is in proportion to the thickness of the multiplication layer in the second area (A2) of the characteristic curve. Therefore, in the second area (A2), as the thickness of the multiplication layer increases, the breakdown voltage increases.

In general, an avalanche photodiode used for single-photon detection or the like exhibits a good characteristic when the thickness of a multiplication layer thereof is in the second area (A2).

In FIGS. 6, Tm1 and Tm2 indicate thicknesses of multiplication layers of two different avalanche photodiodes, respectively. Tm1 and Tm2 are positioned in the second area (A2) of the characteristic curve. For example, Tm1 may be the thickness of a multiplication layer of the first light-reception part (APD1) described above, and Tm2 may be the above-described thickness of a multiplication layer of the second light-reception part (APD2) described above.

In FIG. 6, VB1 indicates a breakdown voltage corresponding to Tm1, and VB2 indicates a breakdown voltage corresponding to Tm2. For example, VB1 may be the above-described breakdown voltage of the first light-reception part (APD1), and VB2 may be the above-described breakdown voltage of the second light-reception part (APD2).

As described above, the magnitude of the breakdown voltage of an avalanche photodiode can be adjusted by the thickness of a multiplication layer included in the avalanche photodiode. For example, as illustrated in FIG. 5, if both the thickness of a multiplication layer of the first light-reception part (APD1) and the thickness of a multiplication layer of the second light-reception part (APD2) are included in the second area (A2) of the characteristic curve, the second light-reception part (APD2) may have a higher breakdown voltage than the first light-reception part (APD1) when the thickness of the multiplication layer of the first light-reception part (APD1) is thicker than the thickness of the multiplication layer of the second light-reception part (APD2). As described above, the second light-reception part (APD2) may be configured to have a higher breakdown voltage than the first light-reception part (APD1) through the thickness of a multiplication layer, so that only the first light-reception part (APD1) can selectively operate in a Geiger mode through the same gate signal (GS).

Figure 7A:
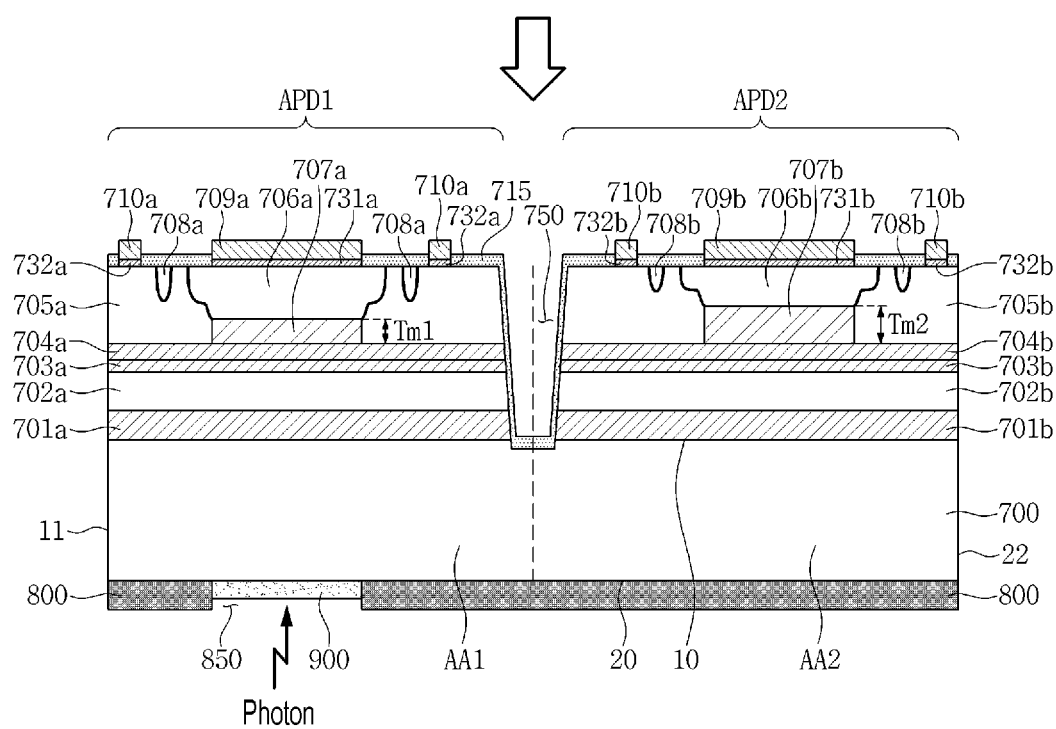
FIG. 7A illustrates a sectional structure of the light-reception part in FIG. 1 of the present disclosure.
Figure 7B:
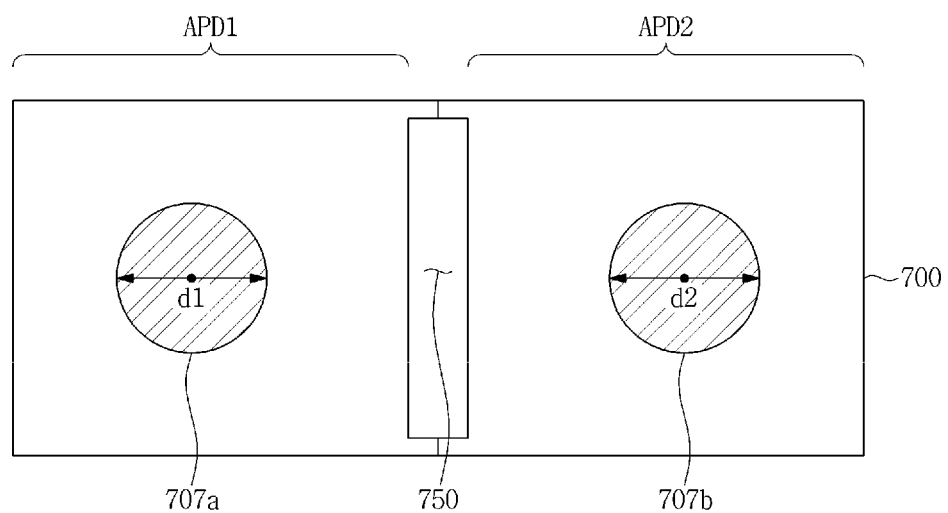
FIG. 7B is a plan view of a first multiplication layer and a second multiplication layer when the light-reception part is seen in the direction of the arrow illustrated in FIG. 7A.

FIG. 7A illustrates a sectional structure of the light-reception part (APD) in FIG. 1 of the present disclosure. FIG. 7B is a plan view illustrating only the position of each of a first multiplication layer 707a and a second multiplication layer 707b when the light-reception part (APD) is seen in the direction of the arrow illustrated in FIG. 7A.

As illustrated in FIGS. 7A and 7B, the light-reception part (APD) may include: a substrate 700; a first conducting layer 701a; a second conducting layer 701b; a first absorption layer 702a; a second absorption layer 702b; a first grading layer 703a; a second grading layer 703b; a first field control layer 704a; a second field control layer 704b; a first window layer 705a; a second window layer 705b; a first anode electrode 709a; a second anode electrode 709b; a cathode electrode 710a; a second cathode electrode 710b; an insulating film 715; a blocking film 800; and an anti-reflection layer 900. However, a description is not limited thereto. Therefore, some layers or films may be selectively removed as necessary.

The substrate 700 includes a first area (A1) and a second area (A2) defined by an element separation groove 750. The element separation groove 750 may be positioned between two sides 11 and 22 opposite to each other. When the opposite sides 11 and 12 of the substrate 700 are defined as a first side 11 and a second side 22, respectively, the first side 11 and the second side 22 face each other in the x-axis direction. The first area (AA1) is positioned between the element separation groove 750 and the first side 11, and the second area (AA2) is positioned between the element separation groove 750 and the second side 22.

Although not illustrated, the light-reception part (APD) of the present disclosure may further include an element separation film buried in the element separation groove 750. The element separation film may include an insulating material.

The substrate 700 may be a substrate including an n-type indium phosphide (InP). Further, the substrate 700 may be a semi-insulating substrate including InP.

The first light-reception part (APD1) is positioned in the first area (AA1) of the substrate 700, and the second light-reception part (APD2) is positioned in the second area (AA2) of the substrate 700.

The first light-reception part (APD1) includes: the first conducting layer 701a; the first absorption layer 702a; the first grading layer 703a; the first field control layer 704a; the first window layer 705a; the first anode electrode 709a; and the cathode electrode 710a. The first window layer 705a may include: a first active area 706a; a first multiplication layer 707a; and a first guard ring 708a.

Similar to the first light-reception part (APD1), the second light-reception part (APD2) includes: the second conducting layer 701b; the second absorption layer 702b; the second grading layer 703b; the second field control layer 704b; the second window layer 705b; the second anode electrode 709b; and the second cathode electrode 710b. The second window layer 705b includes: a second active area 706b; a second multiplication layer 707b; and a second guard ring 708b.

The first conducting layer 701a and the second conducting layer 701b are positioned on the substrate 700. For example, the first conducting layer 701a is positioned in the first area (AA1) of the substrate 700, and the second conducting layer 701b is positioned in the second area (AA2) of the substrate 700. Specifically, the first conducting layer 701a is positioned between the first area (AA1) of the substrate 700 and the first absorption layer 702a, and the second conducting layer 701b is positioned between the second area (AA2) of the substrate 700 and the second absorption layer 702b.

Each of the first conducting layer 701a and the second conducting layer 701b may be a conducting layer including n-type InP.

The first and second absorption layers 702a and 702b convert a photon provided from the outside into a carrier, for example, an electron.

The first absorption layer 702a is positioned on the first conducting layer 701a, and the second absorption layer 702b is positioned on the second conducting layer 701b. Specifically, the first absorption layer 702a is positioned between the first conducting layer 701a and the first grading layer 703a, and the second absorption layer 702b is positioned between the second conducting layer 701b and the second grading layer 703b.

Each of the first absorption layer 702a and the second absorption layer 702b may be an absorption layer including indium gallium arsenide (InGaAs). In contrast, each of the first absorption layer 702a and the second absorption layer 702b may be an absorption layer including indium gallium arsenide phosphide (InGaAsP).

The first grading layer 703a and the second grading layer 703b are formed of a material having an energy band gap between the energy band gap of the absorption layers 702a and 707b and the energy band gap of the field control layers 704a and 704b, so that carriers from the first and second absorption layers 702a and 702b can be smoothly transferred to the first and second multiplication layers 707a and 707b.

The first grading layer 703a is positioned on the first absorption layer 702a, and the second grading layer 703b is positioned on the second absorption layer 702b. Specifically, the first grading layer 703a is positioned between the first absorption layer 702a and the first field control layer 704a, and the second grading layer 703b is positioned between the second absorption layer 702b and the second field control layer 704b.

The first grading layer 703a may include multiple layers vertically laminated along the y-axis.

The second grading layer 703b may include multiple layers vertically laminated along the y-axis.

Each of the first grading layer 703a and the second grading layer 703b may be a grading layer including multiple types of InGaAsP.

The first field control layer 704a controls an electric field of the first multiplication layer 707a, and the second field control layer 704b controls an electric field of the second multiplication layer 707b.

The first field control layer 704a is positioned on the first grading layer 703a, and the second field control layer 704b is positioned on the second grading layer 703b. Specifically, the first field control layer 704a is positioned between the first grading layer 703a and the first window layer 705a, and the second field control layer 704b is positioned between the second grading layer 703b and the second window layer 705b.

Each of the first field control layer 704a and the second field control layer 704b may be a field control layer including n-type InP.

The first multiplication layer 707a and the second multiplication layer 707b multiply charges transferred from the first absorption layer 702a and the second absorption layer 702b.

The first multiplication layer 707a is positioned on the first field control layer 704a, and the second multiplication layer 707b is positioned on the second field control layer 704b. Specifically, the first multiplication layer 707a is positioned between the first field control layer 704a and the first active area 706a, and the second multiplication layer 707b is positioned between the second field control layer 704b and the second active area 706b.

As illustrated in FIG. 7A, the thickness (Tm2) of the second multiplication layer 707b is greater than the thickness (Tm1) of the first multiplication layer 707a.

Further, as illustrated in FIG. 7B, in a plan view, each of the first multiplication layer 707a and the second multiplication layer 707b may have a circular shape. The diameter (d2) of the second multiplication layer 707b may be larger than the diameter (d1) of the first multiplication layer 707a. The first multiplication layer 707a and the second multiplication layer 707b may have shapes other than the circular shape. For example, each of the first multiplication layer 707a and the second multiplication layer 707b may have an elliptical shape.

The thickness of the first multiplication layer 707a may be controlled by controlling the diffusion depth of the first active area 706a or the depth of ion injection into the first active area 706a or by controlling the thickness of an epitaxial layer.

The thickness of the second multiplication layer 707b may be controlled by controlling the diffusion depth of the second active area 706b or the depth of ion injection into the second active area 706b or by controlling the thickness of the epitaxial layer.

When the diffusion depth of the first active area 706a is different from the depth of the second active area 706b, the thickness of the first multiplication layer 707a is different from the thickness of the second multiplication layer 707b. For example, when the depth of the second active area 706b is smaller than the depth of the first active area 706a, the thickness of the second multiplication layer 707b is larger than the thickness of the first multiplication layer 707a.

In order to minimize the deviation between a first capacitive response signal (Cp1) of the first light-reception part (APD1) and a second capacitive response signal (Cp2) of the second light-reception part (APD2), it is preferable that the gap (hereinafter, referred to as "first gap") between the first field control layer 704a and the first active area 706a be maintained as being almost equal to the gap (hereinafter, referred to as "second gap") between the second field control layer 704b and the second active area 706b. However, as described above, when the thickness (Tm2) of the second multiplication layer 707b is larger than the thickness (Tm1) of the first multiplication layer 707a, the second gap is larger than the first gap. Therefore, capacitance of the second light-reception part (APD2) is reduced, and thus the deviation between the first capacitive response signal (Cp1) and the second capacitive response signal (Cp2) may be increased.

When the diameter (d2) of the second multiplication layer 707b increases, the above-described capacitance of the second light-reception part (APD2) may increase. Therefore, when the diameter (d2) of the second multiplication layer 707b increases depending on a change in the thickness (Tm2) of the second multiplication layer 707b, the capacitance of the second light-reception part (APD2) and the capacitance of the first light-reception part (APD1) may be maintained as being substantially equal to each other although the second gap is larger than the firs gap. Eventually, when the thickness (Tm2) and diameter (d2) of the second multiplication layer 707b are larger than the thickness (Tm1) and diameter (d2) of the first multiplication layer 707a, the second capacitive response signal (Cp2) may have substantially the same magnitude as that of the first capacitive response signal (Cp1).

Each of the first multiplication layer 707a and the second multiplication layer 707b may be a multiplication layer including n-type InP.

The first active area 706a is positioned on first multiplication layer 707a, and the second active area 706b is positioned on the second multiplication layer 707b.

Each of the first active area 706a nd the second active area 706b may be an active area including p-type InP.

The first guard ring 708a reduces the electric field peak at which an electric field is concentrated at the outer periphery of the first active area 706a. The second guard ring 708b reduces the electric field peak at which an electric field is concentrated at the outer periphery of the second active area 706b The first guard ring 708a surrounds the first active area 706a. To this end, the first guard ring 708a may have the shape of a closed curve or ring surrounding the first active area 706a.

The second guard ring 708b surrounds the second active area 706b. To this end, the second guard ring 708b may have the shape of a closed curve or ring surrounding the second active area 706b.

The insulating film 715 is positioned on the first window layer 705a, the second window layer 705b, and the element separation groove 750.

The insulating film 715 has via holes for partially exposing the first active area 706a, the second active area 706b, the first window layer 705a, and the second window layer 705b.

The first anode electrode 709a is connected to the first active area 706a through a via hole through which the first active area 706a is exposed. The second anode electrode 709b is connected to the second active area 706b through a via hole through which the second active area 706b is exposed.

The cathode electrode 710a is connected to the first window layer 705a through a via hole through which the first window layer 705a is exposed. The second cathode electrode 710b is connected to the second window layer 705b through a via hole through which the second window layer 705b is exposed.

Two surfaces 10 and 20 of the substrate 700, which face each other, will be defined as a first surface 10 and a second surface 20, respectively. The first surface 10 and the second surface 20 face each other in the y-axis direction. The first conducting layer 701a and the second conducting layer 701b, described above, are positioned on the first surface 10 of the substrate. Further, the blocking film 800 is positioned on the second surface 20 of the substrate 700. The blocking film 800 has a transmission hole 850 positioned to correspond to the first multiplication layer 707a. In other words, the blocking film 800 has the transmission hole 850 positioned to correspond to the first area (AA1).

The blocking film 800 overlaps the second multiplication layer 707b. The second area (AA2) of the substrate 700 is positioned between the blocking film 800 and the second multiplication layer 707b.

Due to the blocking film 800, light or a photon from the outside may be incident on only the first light-reception part (APD1) among the first light-reception part (APD1) and the second light-reception part (APD2).

The anti-reflection layer 900 is positioned in the transmission hole 850. The light or the photon from the outside is provided to the first light-reception part (APD1) through the anti-reflection layer 900 positioned in the transmission hole 850.

The light-reception part (APD) of the present disclosure may include at least one among: an ohmic contact layer 731a positioned between the first anode electrode 709a and the first active area 706a; an ohmic contact layer 732a positioned between the cathode electrode 710*a* and the first window layer 705*a*; an ohmic contact layer 731*b* positioned between the second anode electrode 709*b* and the second active area 706*b*; and an ohmic contact layer 732*b* positioned between the second cathode electrode 710*b* and the second window layer 705*b*.

The photon detection device according to one embodiment of the present disclosure, as described above, provides the following effects.

Firstly, the second light-reception part has a higher breakdown voltage than the first light-reception part on which light or a photon is incident. Therefore, in response to a gate signal having the same magnitude, the first light-reception part operates in a Geiger mode but the second light-reception part does not operate in the Geiger mode. That is, since the second light-reception part operates in a reverse-bias state lower than the reverse-bias state in the Geiger mode, the avalanche multiplication of the second light-reception part is small. Therefore, the probability of occurrence of a dark count of the second light-reception part is reduced, and thus a noise pulse from the second light-reception part is reduced. As a result, the reliability of an output of the first light-reception part affected by the noise pulse may be improved.

Secondly, since the noise pulse from the second light-reception part is reduced, the first light-reception part and the second light-reception part may be manufactured on the same substrate. Therefore, a characteristic of the first light-reception part and a characteristic of the second light-reception part may be maintained as being substantially identical to each other. That is, the characteristic difference between the first light-reception part and the second light-reception part may be minimized.

Thirdly, as the noise pulse from the second light-reception part is reduced, a capacitive response signal having a more accurate magnitude and shape may be detected from the second light-reception part.

Fourthly, a capacitive response signal of the first light-reception part and a capacitive response signal of the second light-reception part have substantially the same characteristic. Therefore, an avalanche signal generated by a small avalanche multiplication may also be accurately detected.

Fifthly, since a digital signal can be detected even when the avalanche multiplication of the first light-reception part is made small, after-pulse noise can be reduced.

Figure 8:
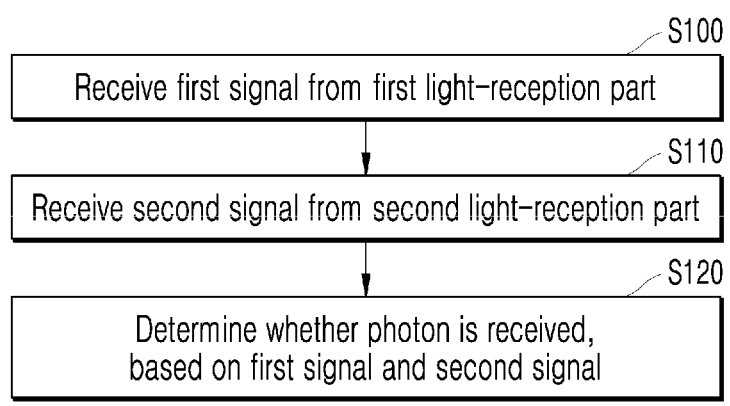
FIG. 8 illustrates a photon detection method according to one embodiment of the present disclosure.

FIG. 8 illustrates a photon detection method according to one embodiment of the present disclosure.

The photon detection method according to one embodiment of the present disclosure includes: (S100) receiving a first signal according to supply of a gate signal from a first light-reception part (APD1) which receives a photon and has a first breakdown voltage; (S110) receiving a second signal according to supply of the gate signal (GS) from a second light-reception part (APD2) which has a second breakdown voltage higher than the first breakdown voltage; and (S120) determining whether a photon is received, based on the first signal and the second signal.

The gate signal (GS) is maintained at a first voltage for an active time period and is maintained at a second voltage lower than the first voltage for a non-active time period other than the active time period.

The gate signal (GS) may be output from the gate signal generator 102. For example, the gate signal generator 102 may output a gate signal (GS) having a pulse shape or a sine wave shape.

The gate signal (GS) output from the gate signal generator 102 is supplied to the first light-reception part (APD1) and the second light-reception part (APD2).

At least one of the first light-reception part (APD1) and the second light-reception part (APD2) operates in a gated Geiger mode (hereinafter, referred to as "Geiger mode") by the gate signal (GS) output from the gate signal generator 102.

If the breakdown voltage of the second light-reception part (APD2) is higher than the breakdown voltage of the first light-reception part (APD1), only the first light-reception part (APD1) selectively operates in the Geiger mode when a gate signal (GS) having the same magnitude is applied to each of the first light-reception part (APD1) and the second light-reception part (APD2).

In other words, when the breakdown voltage of the second light-reception part (APD2) is higher the breakdown voltage of the first light-reception part (APD1), in response to a gate signal (GS) having the same magnitude, the first light-reception part (APD1) may operate in the Geiger mode but the second light-reception part (APD2) may not operate in the Geiger mode. For example, when the magnitude of a gate signal (GS) is higher the breakdown voltage of the first light-reception part (APD1) and lower than the breakdown voltage of the second light-reception part (APD2), the first light-reception part (APD1) may operate in the Geiger mode but the second light-reception part (APD2) may not operate in the Geiger mode.

Whether a photon is received is determined based on a first signal (i.e. an avalanche signal (Av) and a first capacitive response signal (Cp1)) from the first light-reception part (APD1) and on a second signal (i.e. a second capacitive response signal (Cp2)) from the second light-reception part (APD2).

The first capacitive response signal (Cp1) and the second capacitive response signal (Cp2) have substantially the same magnitude. Thus, when the first signal (S1) is combined with the second signal (S2), the phase of which has been inverted, only the avalanche signal (Av) of the first signal (S1) is detected.

That is, the second capacitive response signal (Cp2) of the second signal (S2), the phase of which has been inverted, has the same magnitude as the first capacitive response signal (Cp1) but has a polarity different from that of the first capacitive response signal (Cp1). Thus, the sum of the first capacitive response signal (Cp1) and the second capacitive response signal (Cp2), which have the same magnitude (the same magnitude with reference to an absolute value), is substantially zero (0). Therefore, as illustrated in FIG. 4B, a signal (i.e. an output signal of the differential part 103) generated by a combination of the first signal (S1) and the second signal (S2), the phase of which has been inverted, is an avalanche signal (Av).

The present disclosure described above is not limited to the above-described embodiments and the accompanying drawings. It would be obvious to a person skilled in the art, to which the present disclosure belongs, that various substitutions, modifications, and changes are possible without departing from the technical spirit of the present disclosure.

The invention claimed is:

1. A photon detection device comprising:
   a first light-reception part configured to receive a gate signal and output a first signal;
   a second light-reception part configured to receive the gate signal and output a second signal; and
   a determination part configured to determine whether a photon is received, based on the first signal received from the first light-reception part and the second signal received from the second light-reception part, wherein a breakdown voltage of the first light-reception part configured to receive the photon is lower than a breakdown voltage of the second light-reception part, wherein the gate signal is maintained at a first voltage for an active time period and is maintained at a second voltage lower than the first voltage for a non-active time period other than the active time period, and wherein the first voltage is higher than the breakdown voltage of the first light-reception part and lower than the breakdown voltage of the second light-reception part.

2. The photon detection device of claim 1, wherein the determination part determines whether the photon is received, based on a signal generated by combining the second signal, a phase of which has been inverted, with the first signal.

3. The photon detection device of claim 1, wherein
the first signal comprises a signal originating from a photon reception and a signal originating from the first light-reception part, and
the second signal comprises a signal originating from the second light-reception part.

4. The photon detection device of claim 3, wherein
the signal originating from the first light-reception part is a first capacitive response signal originating from capacitance of the first light-reception part, and
the signal originating from the second light-reception part is a second capacitive response signal originating from capacitance of the second light-reception part, and
the first capacitive response signal is substantially identical to the second capacitive response signal.

5. The photon detection device of claim 1, wherein a multiplication layer included in the first light-reception part and a multiplication layer included in the second light-reception part have different thicknesses.

6. The photon detection device of claim 5, wherein, when the thickness of the multiplication layers is in proportion to a magnitude of the breakdown voltage, the multiplication layer included in the second light-reception part is thicker than the multiplication layer included in the first light-reception part.

7. The photon detection device of claim 5, wherein the multiplication layer included in the first light-reception part and the multiplication layer included in the second light-reception part have different diameters.

8. The photon detection device of claim 7, wherein the multiplication layer included in the second light-reception part has a larger diameter than the multiplication layer included in the first light-reception part.

9. The photon detection device of claim 1, comprising a substrate on which the first light-reception part and the second light-reception part are formed.

10. The photon detection device of claim 9, wherein the first light-reception part and the second light-reception part are positioned on a first surface of the substrate.

11. The photon detection device of claim 10, further comprising a blocking film positioned on a second surface of the substrate facing the first surface of the substrate.

12. The photon detection device of claim 11, wherein the blocking film comprises a transmission hole positioned to correspond to the first light-reception part.

13. The photon detection device of claim 12, further comprising an anti-reflection film positioned in the transmission hole.

14. The photon detection device of claim 10, wherein:
the first surface of the substrate comprises a first area and a second area separated by an element separation groove between the first light-reception part and the second light-reception part; and
the first light-reception part is positioned in the first area and the second light-reception part is positioned in the second area.

15. A photon detection method comprising:
receiving a first signal according to supply of a gate signal from a first light-reception part which receives a photon and has a first breakdown voltage;
receiving a second signal according to supply of the gate signal from a second light-reception part which has a second breakdown voltage higher than the first breakdown voltage, wherein the gate signal is maintained at a first voltage higher than a breakdown voltage of the first light-reception part and lower than a breakdown voltage of the second light-reception part for an active time period, wherein the gate signal is maintained at a second voltage lower than the first voltage for a non-active time period other than the active time period; and
determining whether a photon is received, based on the first signal and the second signal.

16. The photon detection method of claim 15, wherein the determining comprises:
determining whether the photon is received based on a signal generated by combining the second signal, a phase of which has been inverted, with the first signal.

* * * * *